(12) United States Patent
Chataigner et al.

(10) Patent No.: US 10,064,319 B2
(45) Date of Patent: Aug. 28, 2018

(54) MACHINE FOR TRANSFERRING ELECTRONIC COMPONENTS ONTO ELECTRONIC CARDS WITH SENSORS ALONG THE CONVEYOR

(71) Applicant: EUROPLACER INDUSTRIES, Rocheserviere (FR)

(72) Inventors: Gabriel Chataigner, Rocheserviere (FR); Nicolas Pogu, Rocheserviere (FR)

(73) Assignee: EUROPLACER INDUSTRIES, Rocheserviere (FR)

( * ) Notice: Subject to any disclaimer, the term of this patent is extended or adjusted under 35 U.S.C. 154(b) by 0 days.

(21) Appl. No.: 15/507,121

(22) PCT Filed: Aug. 20, 2015

(86) PCT No.: PCT/FR2015/052230
§ 371 (c)(1),
(2) Date: Feb. 27, 2017

(87) PCT Pub. No.: WO2016/030612
PCT Pub. Date: Mar. 3, 2016

(65) Prior Publication Data
US 2017/0280596 A1    Sep. 28, 2017

(30) Foreign Application Priority Data
Aug. 28, 2014 (FR) .................................. 14 58087

(51) Int. Cl.
*B65G 47/31* (2006.01)
*H05K 13/00* (2006.01)
*H05K 13/08* (2006.01)

(52) U.S. Cl.
CPC ......... *H05K 13/0061* (2013.01); *B65G 47/31* (2013.01); *H05K 13/08* (2013.01)

(58) Field of Classification Search
CPC ........ B65G 43/00; B65G 43/08; B65G 43/10; B65G 47/31; B65H 31/3027; B65H 7/08
(Continued)

(56) References Cited

U.S. PATENT DOCUMENTS 4,518,075 A * 5/1985 Aykut .................... B65G 47/31
198/460.1
4,582,506 A * 4/1986 Milsmann ................ B65H 7/08
198/395

(Continued)

FOREIGN PATENT DOCUMENTS

EP          1 509 075 A2    2/2005
JP          H06-286844 A    10/1994
(Continued)

OTHER PUBLICATIONS

International Search Report, dated Nov. 6, 2015, from corresponding PCT application.

*Primary Examiner* — James R Bidwell
(74) *Attorney, Agent, or Firm* — Young & Thompson

(57) ABSTRACT

Disclosed is a machine for transferring electronic components onto electronic cards (4), including: a conveyor (1) on which the electronic cards (4) file past in succession, and sensors (3) disposed along the conveyor in such a way as to determine the position of the electronic cards (4) filing along the conveyor (1). The density of the sensors (3) along the conveyor (1) is sufficiently high such that an electronic card (4) does not leave the field of a sensor (3) before it has entered the field of another sensor (3), over at least a part of the length of the conveyor (1).

20 Claims, 2 Drawing Sheets

(58) Field of Classification Search
USPC .......................... 198/460.1, 781.01, 781.06
See application file for complete search history.

(56) References Cited

U.S. PATENT DOCUMENTS

| | | | | |
|---|---|---|---|---|
| 5,070,995 | A * | 12/1991 | Schaffer ................ | B65G 43/10 198/460.1 |
| 6,729,463 | B2 * | 5/2004 | Pfeiffer ................. | B65G 43/08 198/460.1 |
| 6,792,332 | B1 * | 9/2004 | Depoi ................ | B65H 31/3027 198/459.1 |
| 6,843,362 | B2 * | 1/2005 | Tachibana .............. | B65G 43/10 198/460.1 |
| 7,938,247 | B2 * | 5/2011 | Kujat .................... | B65G 47/31 198/415 |
| 2009/0303485 | A1 | 12/2009 | Kuribara et al. | |

FOREIGN PATENT DOCUMENTS

| | | | |
|---|---|---|---|
| JP | 2004-128244 | A | 4/2004 |
| JP | 2006-278714 | A | 10/2006 |
| JP | 2009-043955 | A | 2/2009 |
| JP | 2012-253114 | A | 12/2012 |
| JP | 2014-078580 | A | 5/2014 |

\* cited by examiner

MACHINE FOR TRANSFERRING ELECTRONIC COMPONENTS ONTO ELECTRONIC CARDS WITH SENSORS ALONG THE CONVEYOR

FIELD OF THE INVENTION

The invention relates to the field of machines for transferring electronic components onto electronic cards, and to the field of methods for transferring electronic components onto electronic cards.

BACKGROUND OF THE INVENTION

According to a first prior art, for example described in patent application JP 2014078580 or patent application EP 1509075 or patent application JP 2004128244, there is a known machine for transferring electronic components onto electronic cards, in which sensors are arranged along the conveyor so as to determine the position of the electronic cards advancing along the conveyor.

However, in this first prior art, these sensors are spaced relatively far apart from one another, so that the position of the electronic cards can only be determined at certain locations, at the positions of the sensors.

If an incident occurs between two sensors, neither of the two sensors will detect it, and only the absence of the electronic card will be observed at the second sensor.

The sensors are often positioned strategically along the conveyor, in order to determine the position of the electronic cards at least at these strategic points.

Coverage of strategic locations along the conveyor at the price of a relatively small number of sensors arranged along this conveyor, constitutes a good compromise between coverage of the length of the conveyor, and the complexity and cost of a monitoring system integrating this relatively small number of sensors.

SUMMARY OF THE INVENTION

Concerning the invention, it has been discovered that the reduced number of sensors not only leaves areas uncovered by the monitoring system, which would be of limited disadvantage when the strategic areas, meaning the most important areas and areas where problems are most likely to occur, are covered by the existing sensors, but also that the position of the sensors dictates the corresponding stop position of the electronic cards.

However, it has become apparent with the invention that it may be of interest to be able to vary this corresponding stop position of the electronic cards, in order to better adapt it to the type and size of the electronic cards, which may vary over time on the same transfer machine.

The invention thus proposes a substantial increase in the density of sensors along the conveyor. This allows covering more areas along the conveyor, which improves the security of the transfer machine, and allows providing more flexibility in the stop position of the electronic cards in relation to the operating constraints of the transfer machine which may vary with the electronic cards being supplied, as the cards may change type or size during operation of the transfer machine, which improves the flexibility of the transfer machine.

The simultaneous improvement to security by increasing the area of coverage of the conveyed electronic cards, and to flexibility by providing greater flexibility in the stop position of the conveyed electronic cards, offsets the increase in complexity of the system which results from increasing the number of sensors per unit length along the conveyor.

Moreover, the high number of sensors arranged along the conveyor can enable the use of simpler and cheaper sensors, thus not increasing the cost of the monitoring system or increasing it only moderately in comparison to the number of sensors added.

The aim of the present invention is to provide a transfer machine which improves both the security and the flexibility of its operation, in comparison to a transfer machine of the prior art.

More particularly, the invention aims to provide a transfer machine, as well as a transfer method, improving both its security and its flexibility, at least partially overcoming the aforementioned disadvantages of the prior art, preferably at the price of a moderate increase in the cost of the monitoring system of this transfer machine.

To this end, the present invention proposes a machine for transferring electronic components onto electronic cards, comprising: a conveyor on which the electronic cards are conveyed in succession, and sensors arranged along the conveyor so as to determine the position of the electronic cards advancing along the conveyor, characterized in that the density of the sensors along the conveyor is sufficiently high such that an electronic card does not leave the field of one sensor before entering the field of another sensor, along at least a portion of the length of the conveyor.

A transfer machine comprises heads for transferring electronic components onto electronic cards.

The heads for transferring electronic components onto electronic cards are heads which take electronic components in order to place them onto one or onto a plurality of electronic cards.

An electronic card is a printed circuit board.

To this end, the invention also provides a method for transferring electronic components onto electronic cards, comprising the use of a transfer machine according to the invention for determining the position of the electronic cards along the conveyor and/or for determining the position of the spaces between electronic cards along the conveyor.

Depending on the embodiments of the invention, the transfer machine allows continuous monitoring of the electronic cards, where said monitoring allows anticipating incidents or managing them quickly, and/or allows continuous monitoring of the spaces between electronic cards, where said monitoring also allows anticipating incidents or managing them quickly, and/or allows a fairly accurate estimation of the length of the electronic cards, which enables optimized positioning of the electronic cards for the operation of transferring electronic components thereon, and thus reducing or even minimizing conveyance errors. The estimation of the length of the cards also makes it possible to detect basic usage errors. For example, if the estimated length of a card is sufficiently different from the expected length, this may indicate that the card on the conveyor is not the correct one or that two juxtaposed cards were introduced together.

Depending on the embodiments of the invention, it is thus possible to have a continuous view of the movements of the electronic cards and therefore to detect possible incidents such as obstruction of electronic cards, manual removal of electronic cards, manual insertion of electronic cards; and/or also to monitor the spaces between two consecutive electronic cards in order to be able to verify that one is not catching up to the other; and/or to obtain quite accurate estimates of the length of an electronic card, enabling error detection or the adoption of operating modes optimized for the type and size of the electronic card advancing along the conveyor, for example in order to be able to stop an electronic card at the exact desired location along the conveyor and not somewhat near the desired location, and/or for example to reduce the path distances of the transfer head, reduce the interference between transfer heads, optimize the use of each transfer head.

Knowledge of the space between two consecutive cards makes it possible to increase or decrease this space between two cards, when combined with the possibility of differentiating the speed of advancement of two consecutive sections. For example, it may be advantageous to load several previously dissociated cards onto the same conveyor section in order to process them in batches with the transfer machine, which can increase operational efficiency. Similarly, a speed differential between two successive conveyor sections makes it possible to separate adjacent cards.

A transfer head is the tool that takes electronic components in order to place them on the electronic card.

According to preferred embodiments, the invention comprises one or more of the following features which may be used separately or in combination of some or all of the features.

Preferably, the portion of the length of the conveyor comprises at least three, possibly at least four, sensors. Precise monitoring of the electronic cards is then carried out in a multi-sensor area.

Preferably, the portion of the length of the conveyor comprises at least the transfer area(s) for transferring electronic components onto the electronic cards. This transfer area or these transfer areas are particularly sensitive areas concerning the positioning of the electronic cards, since this is where the electronic components are placed on the electronic cards. Accurate monitoring of the electronic cards in these sensitive areas is therefore of particular interest.

Preferably, the portion of the length of the conveyor also comprises at least the intermediate area or areas between the transfer areas for transferring electronic components onto the electronic cards and/or the portion of the length of the conveyor also comprises the area upstream of the first transfer area and/or the area downstream of the last transfer area for transferring electronic components onto the electronic cards. The more extensive the area of precise electronic monitoring, the greater the overall improvement to the security and flexibility of the transfer machine.

Preferably, the density of the sensors along the conveyor is sufficiently high such that an electronic card does not leave the field of one sensor before entering the field of another sensor, all along the conveyor. The more extensive the area of precise electronic monitoring, the greater the overall improvement to the security and flexibility of the transfer machine.

Preferably, the density of the sensors along the conveyor is sufficiently high such that no portion of the electronic card leaves the field of one sensor before entering the field of another sensor, along at least a portion of the length of the conveyor or along the entire length of the conveyor. The more extensive the area of precise electronic monitoring, the greater the overall improvement to the security and flexibility of the transfer machine.

Preferably, the sensors are optical sensors. Incident detection is thus very fast, improving security. In addition, there is no fear of electromagnetic interference with the electronic cards or electronic components.

Preferably, the sensors are sweep-activation sensors, with only one sensor being activated at a time. As the density of the sensors is high, when the sensors are not entirely directional each sensor will have some degree of optical pollution by the signals of the neighboring sensors. Sweep activation, which temporally sequences the activation of the optical sensors, avoids such optical pollution by neighboring sensors. In another alternative embodiment, the sensors are sweep-activation sensors with only some of the sensors being activated at a time, advantageously such that two contiguous sensors are never activated simultaneously. For example, all the even sensors, then all the odd sensors, then all even sensors again, and so on.

Preferably, the sensors are located along the conveyor, on the side or sides of the conveyor. The compromise between detection simplicity and detection efficiency is thus improved, and therefore detection security as well.

The sensors preferably comprise a strip of transmitters located on one side of the conveyor and a strip of receivers located on the other side of the conveyor. Implementation of this sensor assembly is then particularly simple. All transmitters are aligned with one another. All receivers are aligned with one another. The strip of transmitters and the strip of receivers are preferably parallel to one another. The strip of transmitters and the strip of receivers are positioned to face one another, so that each receiver is located opposite a transmitter where the transmitter can illuminate it in the absence of an electronic card.

Preferably, the strip of transmitters is located below the conveyor and the strip of receivers is located above the conveyor, or vice versa with the strip of transmitters located above the conveyor and the strip of receivers located below the conveyor. There is thus clear detection of the presence/absence of an electronic card, with the light beam striking the surface of the electronic card. Detection remains good even in the case of non-optimal positioning of the sensors. Consequently, the detection accuracy as well as the tolerance regarding the arrangement of sensors in the space are better than if all sensors were arranged at the level of the electronic cards, with the light beam only striking the thin edge of the electronic card.

In an optional embodiment, each transmitter is a laser light transmitter. The collimated light of the laser beam eliminates any light pollution of a sensor by neighboring sensors. This type of laser light source is relatively expensive, however.

In an alternative preferred embodiment, each transmitter is a non-collimated light transmitter, and only one transmitter/receiver pair is operational at a time, with sweep activation of the transmitter/receiver pairs one after the other. Thus, although using light sources that are much cheaper than laser light sources, light pollution of a sensor by neighboring sensors is virtually eliminated.

Preferably, the distance between transmitters and receivers is variable, and a compensation function compensates for the corresponding variation in signal, using as reference the receiver or receivers receiving the maximum signal. Again in order to provide more flexibility, the width of the conveyor is variable so that it can be adapted to the width of the electronic cards it is conveying. This variation in conveyor width could be a source of interference with the detection of optical signals by the sensors. The compensation function eliminates or greatly reduces such potential interference.

Preferably, the sensor density is at least 10 sensors per meter along the conveyor, more preferably at least 15 sensors per meter along the conveyor, for example about 20 sensors per meter along the conveyor. Coverage along the length of the conveyor is thus improved.

Preferably, the transfer method comprises the use of a transfer machine according to the invention where the size information for the electronic cards is compared with the expected size in order to detect operational anomalies.

Preferably, the transfer method comprises the use of a transfer machine according to the invention where the dimension information for the space between two consecutive electronic cards is used to detect operational anomalies.

Preferably, the transfer method comprises the use of a transfer machine according to the invention for increasing or decreasing the distance between two successive electronic cards, by combining the measurement of this distance with a speed differential between two successive conveyor sections.

Other features and advantages of the invention will become apparent upon reading the following description of a preferred embodiment of the invention, given by way of example and with reference to the accompanying drawings.

DETAILED DESCRIPTION OF INVENTION

Figure 1:
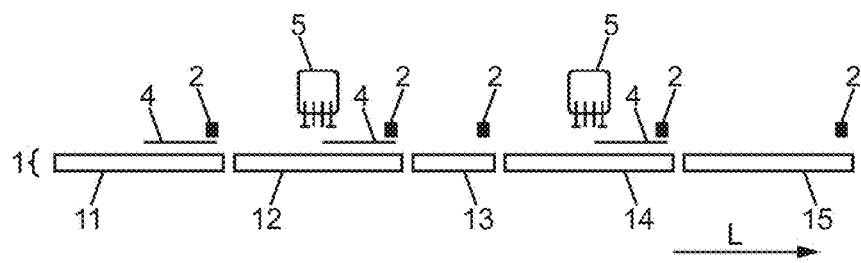
FIG. 1 schematically represents a side view of an exemplary transfer machine according to prior art.

FIG. 1 schematically represents a side view of an exemplary transfer machine according to prior art. The transfer machine comprises a conveyor 1 on which electronic cards 4 advance. Transfer heads 5 are responsible for taking electronic components from one or more electronic component dispensers (not shown) in order to place them onto the electronic cards 4 when the cards pass by the transfer heads 5.

The electronic cards 4 advance along the conveyor 1 in the direction and orientation of travel indicated by the arrow L. Sensors 2 are positioned along the conveyor 1 at certain locations, in particular to enable monitoring and stopping the cards at those locations.

The machine for transferring electronic components for mounting on the surface of the electronic cards 4 is often used on the production line, meaning that the various machines required for producing electronic cards 4, namely the screen printing machine, the oven, the transfer machine of the invention, and the test device, are placed one after another, with the electronic cards 4 passing through each of these.

The conveyor 1 is the element which circulates the electronic cards through all the machines and in particular through the transfer machine of the invention. The conveyor 1 thus traverses all the machines, and in particular the transfer machine.

The conveyor 1 may be divided into several areas or sections. The conveyor 1 comprises an optional upstream area 11 which is an infeed section 11, followed by a first transfer area 12 which is a first placement section, followed by an optional intermediate area 13 which is an intermediate section, followed by a second transfer area 14 which is a second placement section, followed by an optional downstream area 15 which is an outfeed section.

The upstream area 11 is where the electronic card 4 arrives from the machine preceding the transfer machine.

Transfer areas 12 and 14 present the electronic card 4 for placement, by the transfer heads 5, of the electronic components that the transfer heads 5 have taken from one or more electronic component dispensers (not shown in FIG. 1). Usually, the electronic card 4 is immobilized in position on these transfer areas 12 and 14 during placement of the electronic components.

When the transfer areas 12 and 14 are not contiguous, one or more intermediate areas 13 are provided for the passage of the electronic card 4 between two transfer areas 12 and 14 of the conveyor 1.

A downstream area 15 allows sending the electronic card 4, once the electronic components have been placed on it, to the machine which follows the transfer machine in the production line for electronic cards 4.

Each area 11 to 15 is equipped with a sensor 2 at a fixed position, for determining the stop positions or possibly the slowing of the electronic cards 4. Consequently, regardless of the length of the electronic card 4, its stop position for each area 11 to 15 will be fixed and will be determined solely by the position of the sensor 2 of the corresponding area. The only way to shift the stop position of the electronic cards is therefore to physically move the corresponding sensors 2. An example of incorrect or inadequate positioning is presented in relation to FIGS. 2A and 2B.

Another disadvantage of this transfer machine is that, during the displacements of the electronic card 4, said card is no longer seen by any sensor 2 of the monitoring system of the conveyor 1, over a large portion of areas 11 to 15. If an incident occurs, for example a blockage or slowed movement or manual removal of the electronic card 4, the monitoring system will only have information indicating the non-arrival of the electronic card 4, systematically resulting in an error which is difficult to recover from. Similarly, if one electronic card 4 catches up to another one, there is a strong probability that this will not be seen by the monitoring system.

Figure 2A:
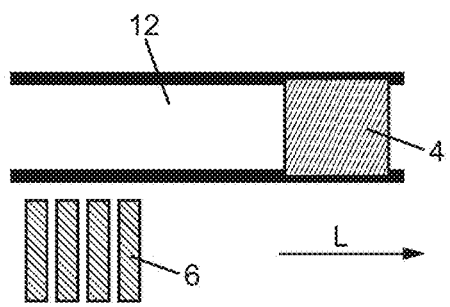
FIGS. 2A and 2B schematically represent plan views of an example illustrating the issues related to the stop position of electronic cards on a transfer machine according to prior art.
Figure 2B:
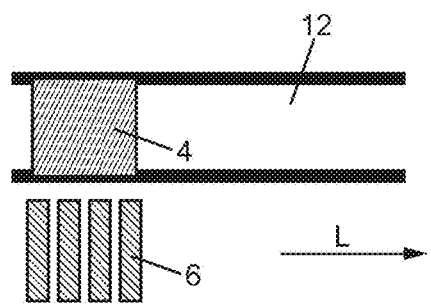

FIGS. 2A and 2B schematically represent plan views of an example illustrating the issues related to the stop position of electronic cards on a transfer machine according to prior art.

In FIG. 2A, the sensor 2 has been shifted so that the machine can accept cards of great length, up to the full length of the conveyor. A small electronic card 4 has been stopped at a stop position, on the transfer area 12 of the conveyor 1, which is not optimal relative to the arrangement of the electronic component dispenser 6 which is too far from the electronic card 4, which will result in a longer and more complex displacement of the transfer head responsible for taking electronic components from the dispenser 6 to place them on the electronic card 4.

In FIG. 2B, due to the ideal position of the sensor 2, the electronic card 4 has been stopped at a stop position, on the transfer area 12 of the conveyor 1, which is optimal relative to the arrangement of the electronic component dispenser 6 which is located right next to the electronic card 4, resulting in a short and simple to manage displacement of the transfer head responsible for taking electronic components from the dispenser 6 to place them on the electronic card 4.

The stop position of the electronic cards 4 has an impact on the performance of the transfer machine. Depending on the size or type of electronic card 4, the arrangement of the electronic component dispensers 6, or even the architecture and type of the transfer head or heads 5 used, the optimal stop position of the electronic card 4 for placement of the electronic components may vary.

In the case of a transfer machine to which numerous production changes are made, meaning to the conveyor 1 carrying electronic cards 4 which differ from one another because they have different sizes or because they are of different types, or because the position of the dispenser 6 has changed, the operator of the transfer machine needs to modify the stop positions of the electronic cards 4, which either is impossible because of the design of the transfer machine or is too tedious and/or takes too long to be truly effective. This is why, in practice, this type of displacement of the sensors 2 along the conveyor 1 is not implemented.

Figure 3:
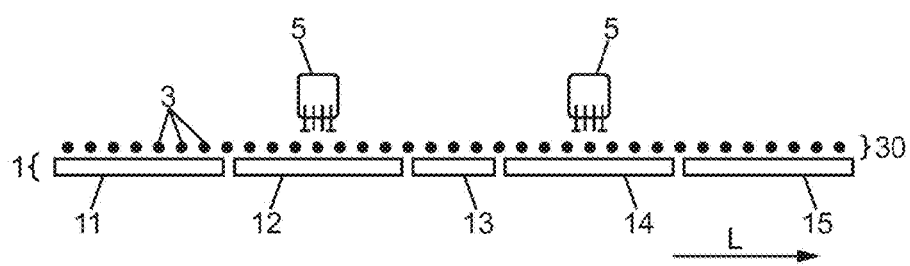
FIG. 3 schematically represents a side view of an exemplary transfer machine according to an embodiment of the invention.

The lack of flexibility of the transfer machine shown in FIGS. 1 and 2A and 2B, which is disadvantageous, will be corrected by an embodiment of the invention presented in FIG. 3.

FIG. 3 schematically represents a side view of an exemplary transfer machine according to an embodiment of the invention. The transfer machine comprises a conveyor 1 on which electronic cards 4 advance. Transfer heads 5 are responsible for taking electronic components from one or more electronic component dispensers (not shown) to place them on the electronic cards 4 when they pass by the transfer heads 5.

As in FIG. 1, the conveyor 1 may be divided into several areas or sections. The conveyor 1 comprises an optional upstream area 11 which is an infeed section 11, followed by a first transfer area 12 which is a first placement section, followed by an optional intermediate area 13 which is an intermediate section, followed by a second transfer area 14 which is a second placement section, followed by an optional downstream area 15 which is an outfeed section.

The electronic cards 4 advance along the conveyor 1 in the direction and orientation of travel indicated by the arrow L. Sensors 3 are positioned along the conveyor 1, in particular for monitoring and stopping the electronic cards 4 at any desired location all along the conveyor 1.

The sensors 3, which are regularly distributed one after another in succession are arranged in the form of a strip 30 of sensors 3.

Figure 4:
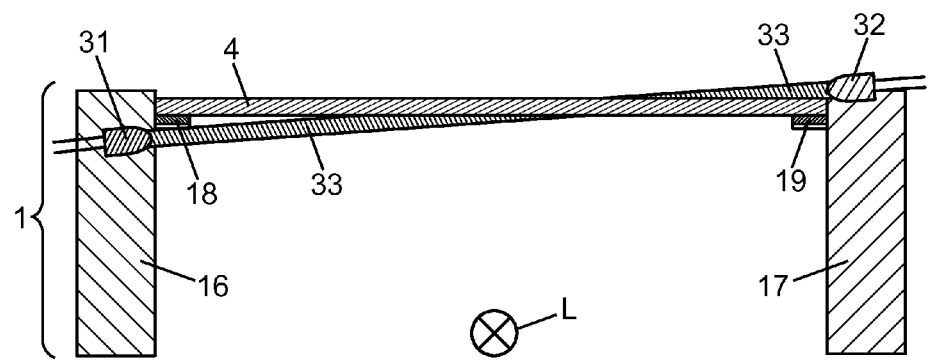
FIG. 4 schematically represents a front view of an exemplary transfer machine according to an embodiment of the invention.

FIG. 4 schematically represents a front view of an exemplary transfer machine according to an embodiment of the invention. The direction of travel L of the electronic cards 4 on the conveyor 1 is perpendicular to the plane of FIG. 4. On one side of the conveyor 1 there is a strip of transmitters 31 which is placed on one of the uprights 16 of the conveyor 1, and on the other side of the conveyor 1 there is a strip of receivers 32 which is placed on the other upright 17 of the conveyor 1 and which is mounted facing the strip of transmitters 31. Each sensor 3 of FIG. 3 corresponds to a transmitter 31 and corresponding receiver 32 in FIG. 4.

Between the uprights 16 and 17 of the conveyor 1 are conveyor belts 18 and 19, respectively placed against the uprights 16 and 17, which support and transport the electronic card 4. The strip of transmitters 31 is located slightly below the level of the conveyor belts 18 and 19 as well as of the electronic card 4. The strip of receivers 32 is located slightly above the level of the conveyor belts 18 and 19 as well as of the electronic card 4.

The light beams 33, which travel from the transmitters 31 to the receivers 32, are either blocked by the surface of the electronic card 4, thus revealing the presence of an electronic card 4 at that level, or pass through the free space left between them, thus revealing the absence of an electronic card 4 at that level. These optical beams 33 are therefore beams for detecting the presence or absence of electronic cards 4 at their level. Due to the high density of these optical beams 33 because of the high density of the transmitters 31 and receivers 32, the monitoring system knows precisely where the electronic cards 4 are located all along their travel on the conveyor 1.

Figure 5:
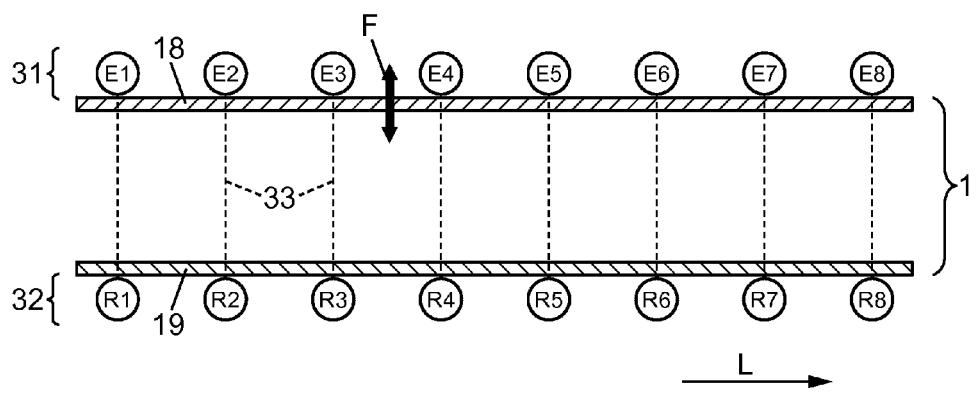
FIG. 5 schematically represents a plan view of an exemplary transfer machine according to an embodiment of the invention.

FIG. 5 schematically represents a plan view of an exemplary transfer machine according to one embodiment of the invention.

The strip of transmitters 31 comprises 8 transmitters E1 to E8, respectively placed opposite the receivers R1 to R8 of the strip of receivers 32. The dashed lines represent the light beams 33 which are blocked by each electronic card passing through the space between the transmitters E1 to E8 and the receivers R1 to R8, which is also the space between the conveyor belts 18 and 19.

In a first optional embodiment, the transmitters E1 to E8 are all laser light sources. In this case, since the light of the light beams 33 is perfectly collimated, each light beam 33 illuminates only the receiver, for example R4, corresponding to the transmitter, for example E4, which emitted it. All transmitters E1 to E8 can operate simultaneously and emit light continuously.

In a second embodiment which is preferred as it is less expensive than the first optional embodiment previously described, the transmitters E1 to E8 are all non-collimated light sources. In this case, since the light from the light beams 33 is not collimated, not only does each light beam 33 illuminate the receiver, for example R4, corresponding to the transmitter, for example E4, which emitted it, but also the neighboring receivers, for example at least receivers R3 and R5, possibly also receivers R2 and R6.

One solution to eliminate this disadvantage of optical pollution on neighboring receivers consists of turning on only one transmitter at a time, for example transmitter E4, so that only the corresponding receiver, for example receiver R4, is illuminated by the light beam 33 emitted by transmitter E4, the received signal then being measured only at receiver R4. Next, only the paired transmitter E5 and receiver R5 will be activated, and so on. The use of relatively simple optoelectronic components makes it possible to carry out a rapid sweep activation of all transmitter/receiver pairs, namely, in succession, E1/R1, E2/R2, E3/R3, E4/R4, E5/R5, E6/R6, E7/R7, E8/R8, again E1/R1, and so on.

In a preferred embodiment, one side of the conveyor 1 is adjustable to accommodate varying widths of electronic cards 4, for example the upright 16 supporting conveyor belt 18. This adjustment, which consists of moving conveyor belt 18 closer to or further from conveyor belt 19, is represented by arrow F.

As a result, the distance between the transmitters 31 and receivers 32 is highly variable, which significantly affects the signal received by each receiver 32. An algorithm makes it possible to compensate for this variation by using the receiver or receivers 32 which receive the most signal as a reference, meaning those which do not have an electronic card in their field. Similarly, an initial calibration can compensate for variations in sensitivity between the various receivers 32 and between the differences in output from the transmitters 31.

In an optional embodiment, it is possible to know the position of the motors operating the conveyor belts 18 and 19, in particular if the motors are provided with position or speed sensors which then allow deducing the position by integration, or if the motors are stepper motors. When this motor position information is then combined with the information from the optical sensors 3, the position of each electronic card 4 along the conveyor 1 can then be estimated, again with both a high degree of confidence and a greater accuracy.

Of course, the invention is not limited to the examples and the embodiment described and shown, but is suitable for numerous variants accessible to those skilled in the art.

The invention claimed is:

1. A method for transferring electronic components onto electronic cards (4), comprising using a transfer machine for transferring electronic components onto electronic cards (4), the transfer machine comprising a conveyor (1) on which the electronic cards (4) are conveyed in succession, and sensors (3) arranged along the conveyor so as to determine the position of the electronic cards (4) advancing along the conveyor (1), wherein the density of the sensors (3) along the conveyor (1) is sufficiently high such that an electronic card (4) does not leave the field of one sensor (3) before entering the field of another sensor (3), for at least a portion of the length of the conveyor (1), wherein the portion of the length of the conveyor (1) comprises at least three sensors (3), and wherein the portion of the length of the conveyor (1) comprises at least all a transfer area or all transfer areas (12, 14) for transferring electronic components onto the electronic cards.

2. The method for transferring electronic components onto electronic cards (4), according to claim 1, wherein the portion of the length of the conveyor (1) comprises at least four sensors (3).

3. The method for transferring electronic components onto electronic cards (4), according to claim 1, wherein the portion of the length of the conveyor (1) also comprises at least all intermediate area or all intermediate areas (13) between the transfer areas (12, 14) for transferring electronic components onto the electronic cards (4) and/or the portion of the length of the conveyor (1) also comprises all area (11) upstream of the first transfer area (12) and/or all area (15) downstream of the last transfer area (14) for transferring electronic components onto the electronic cards (4).

4. The method for transferring electronic components onto electronic cards (4), according to claim 1, wherein the density of the sensors (3) along the conveyor (1) is sufficiently high such that an electronic card (4) does not leave the field of one sensor (3) before entering the field of another sensor (3), all along the conveyor (1).

5. The method for transferring electronic components onto electronic cards (4), according to claim 1, wherein the density of the sensors (3) along the conveyor (1) is sufficiently high such that no portion of the electronic card (4) leaves the field of one sensor (3) before entering the field of another sensor (3), along at least a portion of the length of the conveyor (1) or along the entire length of the conveyor (1).

6. The method for transferring electronic components onto electronic cards (4), according to claim 1, wherein the sensors (3) are optical sensors.

7. The method for transferring electronic components onto electronic cards (4), according to claim 1, wherein the sensors (3) are sweep-activation sensors, with only one sensor (3) being activated at a time.

8. The method for transferring electronic components onto electronic cards (4), according to claim 1, wherein the sensors (3) are located along the conveyor (1), on the side or sides of the conveyor (1).

9. The method for transferring electronic components onto electronic cards (4), according to claim 1, wherein the sensors (3) comprise a strip of transmitters (31) located on one side of the conveyor (1) and a strip of receivers (32) located on the other side of the conveyor (1).

10. The method for transferring electronic components onto electronic cards (4), according to claim 9, wherein the strip of transmitters (31) is located below the conveyor (1) and the strip of receivers (32) is located above the conveyor (1), or vice versa.

11. The method for transferring electronic components onto electronic cards (4), according to claim 9, wherein each transmitter (31) is a non-collimated light transmitter and only one transmitter (31)/receiver (32) pair is operational at a time, with sweep activation of the transmitter (31)/receiver (32) pairs one after the other.

12. The method for transferring electronic components onto electronic cards (4), according to claim 1, wherein the distance between transmitters (31) and receivers (32) is variable, and a compensation function compensates for the corresponding variation in signal, using as reference the receiver or receivers (32) receiving the maximum signal.

13. The method for transferring electronic components onto electronic cards (4), according to claim 1, wherein the density of the sensors (3) is at least 10 sensors per meter along the conveyor (1).

14. The method for transferring electronic components onto electronic cards (4) according to claim 1 including determining the position and dimension of the electronic cards (4) along the conveyor (1) and/or determining the position and dimension of the spaces between electronic cards (4) along the conveyor.

15. The method for transferring electronic components onto electronic cards (4), according to claim 14, including comparing the size information for the electronic cards (4) with the expected size in order to detect operational anomalies.

16. The method for transferring electronic components onto electronic cards (4), according to claim 14, including using the dimension information for the space between two consecutive electronic cards (4) to detect operational anomalies.

17. The method for transferring electronic components onto electronic cards (4), according to claim 14, including increasing or decreasing the distance between two successive electronic cards, by combining the measurement of this distance with a speed differential between two successive conveyor sections.

18. The method for transferring electronic components onto electronic cards (4), according to claim 2, wherein the density of the sensors (3) along the conveyor (1) is sufficiently high such that an electronic card (4) does not leave the field of one sensor (3) before entering the field of another sensor (3), all along the conveyor (1).

19. The method for transferring electronic components onto electronic cards (4), according to claim 1, wherein the density of the sensors (3) is at least 15 sensors per meter along the conveyor (1).

20. A machine for transferring electronic components onto electronic cards (4), comprising:
a conveyor (1) on which the electronic cards (4) are conveyed in succession, and
sensors (3) arranged along the conveyor so as to determine the position of the electronic cards (4) advancing along the conveyor (1),
wherein the density of the sensors (3) along the conveyor (1) is sufficiently high such that an electronic card (4) does not leave the field of one sensor (3) before entering the field of another sensor (3), for at least a portion of the length of the conveyor (1), and wherein the distance between transmitters (31) and receivers (32) is variable, and a compensation function compensates for the corresponding variation in signal, using as reference the receiver or receivers (32) receiving the maximum signal.

\* \* \* \* \*